(12) United States Patent
Fu et al.

(10) Patent No.: US 8,971,423 B1
(45) Date of Patent: Mar. 3, 2015

(54) SYSTEMS AND METHODS FOR LOCKING AN OSCILLATOR TO AN INCOMING DATA SIGNAL

(75) Inventors: Wei Fu, San Diego, CA (US); Hongming An, San Diego, CA (US); Bin Nie, Shenzhen (CN); Jun Ye, Shenzhen (CN)

(73) Assignee: SMSC Holdings S.A.R.L., Luxembourg (LU)

( * ) Notice: Subject to any disclaimer, the term of this patent is extended or adjusted under 35 U.S.C. 154(b) by 870 days.

(21) Appl. No.: 12/721,432

(22) Filed: Mar. 10, 2010

(51) Int. Cl.
*H04K 1/10* (2006.01)
*H03D 3/24* (2006.01)
*H03K 5/19* (2006.01)

(52) U.S. Cl.
USPC .............................. 375/260; 375/376; 327/20

(58) Field of Classification Search
USPC ...................... 375/260, 376; 327/20
See application file for complete search history.

(56) References Cited

U.S. PATENT DOCUMENTS

| | | | |
|---|---|---|---|
| 6,249,192 B1 * | 6/2001 | Gabara et al. ............. | 331/117 R |
| 6,803,827 B1 * | 10/2004 | Kenney et al. .................. | 331/16 |
| 6,900,676 B1 * | 5/2005 | Tamura .......................... | 327/156 |
| 7,089,444 B1 * | 8/2006 | Asaduzzaman et al. ...... | 713/600 |
| 7,349,515 B1 * | 3/2008 | Chew et al. ................... | 375/376 |
| 2002/0094055 A1 * | 7/2002 | Cranford et al. .............. | 375/376 |
| 2002/0168952 A1 * | 11/2002 | Vishakhadatta et al. ...... | 455/130 |
| 2002/0181361 A1 * | 12/2002 | Nishida ...................... | 369/47.28 |
| 2003/0078022 A1 * | 4/2003 | Cai ................................ | 455/260 |
| 2003/0224747 A1 * | 12/2003 | Anand .......................... | 455/208 |
| 2004/0201428 A1 * | 10/2004 | Kenney et al. .................. | 331/16 |
| 2005/0030001 A1 * | 2/2005 | Jasa et al. .................... | 324/76.53 |
| 2005/0129019 A1 * | 6/2005 | Borker et al. ................. | 375/220 |
| 2006/0056498 A1 * | 3/2006 | Clancy et al. ................. | 375/219 |
| 2006/0165204 A1 * | 7/2006 | Shumarayev et al. ........ | 375/371 |
| 2007/0247200 A1 * | 10/2007 | Zachan et al. ................ | 327/156 |
| 2008/0260087 A1 * | 10/2008 | Liang et al. ................... | 375/376 |

* cited by examiner

*Primary Examiner* — Chieh M Fan
*Assistant Examiner* — Sarah Hassan
(74) *Attorney, Agent, or Firm* — King & Spalding L.L.P.

(57) ABSTRACT

In one example, a system includes an oscillator adapted to provide an oscillator signal, a frequency divider adapted to divide the oscillator signal to provide a divided oscillator signal, and a phase-frequency detector adapted to provide phase-frequency detection signals in response to a reference clock signal and the divided oscillator signal. The system also includes a charge pump adapted to provide first output signals in response to the phase-frequency detection signals, a phase detector adapted provide second output signals in response to an incoming data signal and the oscillator signal, and one or more switches adapted to pass the first output signals during a frequency acquisition mode and pass the second output signals during a phase lock mode. The system also includes an active filter adapted to filter the passed first or second output signals. The oscillator is adapted to adjust a frequency of the oscillator signal in response to the filtered first or second output signals.

19 Claims, 4 Drawing Sheets

SYSTEMS AND METHODS FOR LOCKING AN OSCILLATOR TO AN INCOMING DATA SIGNAL

BACKGROUND

1. Field of the Invention

The present invention relates generally to electrical circuits and, more particularly, to systems and methods for clock and data recovery.

2. Related Art

In a typical serial link non-return-to-zero (NRZ) modulated receiver (e.g., a Universal Serial Bus (USB) 3.0 device, an optical transceiver, or other device), clock information is embedded in an incoming data signal to lower chip pin count and power. Clock and data recovery (CDR) is traditionally used inside the receiver to recover a clock signal from the incoming data signal. Data can then be recovered from the incoming data signal using the recovered clock in a relatively straightforward manner.

Conventionally, a phase-locked loop (PLL) circuit may be used to perform CDR operations including frequency acquisition and phase locking. As is well known, the oscillation frequency of an on-chip voltage controlled oscillator (VCO) of a PLL circuit may exhibit a large process-voltage-temperature (PVT) spread. Accordingly, a first task of a PLL circuit is typically to perform a frequency/phase detection to pull the VCO oscillation frequency clock close to the recovery clock frequency. The pull-in range (e.g., the largest frequency deviation that can be reliably locked) of the frequency/phase detection may be relatively small if the incoming data signal is used as a reference. To solve this problem, a reference clock with a small frequency deviation (e.g., less than approximately one percent) may be used as the reference. The frequency of the reference clock may have a constant relationship to the data baud frequency of the incoming data signal (e.g., which corresponds to the far-end modulation clock frequency). For example, the data baud frequency may be an integer or fractional multiple (e.g., greater than one) of the reference clock frequency.

After frequency acquisition is performed, the PLL circuit is typically switched from using the reference clock to using the incoming data signal as a reference. The PLL circuit then performs a phase locking operation to lock the VCO oscillation frequency with the frequency of the incoming data.

A conventional loop filter of a PLL circuit typically includes either a charge pump (e.g., including one or more passive filters) or an active filter (e.g., including one or more input resistors). If the data baud frequency of the incoming data signal is very high (e.g., a Super Speed USB 3.0 signal operating at approximately 5 Gbps), the output signal of the phase detector (e.g., a linear phase detector providing a predictable loop bandwidth and damping factor for the PLL circuit) may be much higher than 5 GHz depending on the clock phase of the VCO and the data phase of the incoming data signal. However, in a conventional PLL circuit where a charge pump is utilized as a loop filter, the high frequency output signal of the phase detector may have difficulty switching the input differential pair of the charge pump while still maintaining reasonable power consumption. Thus, in conventional PLL circuits, the high frequency output signal of the phase detector may be effectively blocked by the charge pump.

Also in a conventional PLL circuit using an active filter including one or more input resistors, if the VCO oscillation frequency (e.g., approximately 5 GHz) is much higher than the reference clock frequency (e.g., approximately 20 MHz), then the output frequency of the phase-frequency detector may be much lower than 5 GHz. However, in this case, the open loop gain of the active filter may be 250 times lower when performing frequency/phase detection operations than when performing phase locking operations. As a result, the conventional PLL circuit may exhibit a large static phase offset when performing frequency/phase detection operations.

As a result, there is a need for an improved approach to the detection and recovery of clocks associated with incoming data signals.

SUMMARY

Various techniques are provided for locking an oscillator to an incoming data signal. Such techniques may be used, for example, to recover a clock as part of clock and data recovery operations performed on the incoming data signal. In one embodiment, a system includes an oscillator adapted to provide an oscillator signal. The system also includes a frequency divider adapted to divide the oscillator signal to provide a divided oscillator signal. The system also includes a phase-frequency detector adapted to provide phase-frequency detection signals in response to a reference clock signal and the divided oscillator signal. The system also includes a charge pump adapted to provide first output signals in response to the phase-frequency detection signals. The system also includes a phase detector adapted provide second output signals in response to an incoming data signal and the oscillator signal. The system also includes one or more switches adapted to pass the first output signals during a frequency acquisition mode and pass the second output signals during a phase lock mode. The system also includes an active filter adapted to filter the passed first or second output signals. The oscillator is adapted to adjust a frequency of the oscillator signal in response to the filtered first or second output signals.

In another embodiment, a method includes providing an oscillator signal using an oscillator. The method also includes dividing the oscillator signal using a frequency divider to provide a divided oscillator signal. The method also includes providing phase-frequency detection signals from a phase-frequency detector in response to a reference clock signal and the divided oscillator signal. The method also includes providing first output signals from a charge pump in response to the phase-frequency detection signals. The method also includes providing second output signals from a phase detector in response to an incoming data signal and the oscillator signal. The method also includes switching between passing the first output signals during a frequency acquisition mode and passing the second output signals during a phase lock mode. The method also includes filtering the passed first or second output signals using an active filter. The oscillator is adapted to adjust a frequency of the oscillator signal in response to the filtered first or second output signals.

In another embodiment, a system includes means for providing an oscillator signal. The system also includes means for dividing the oscillator signal to provide a divided oscillator signal. The system also includes means for providing phase-frequency detection signals in response to a reference clock signal and the divided oscillator signal. The system also includes mans for providing first output signals in response to the phase-frequency detection signals. The system also includes means for providing second output signals in response to an incoming data signal and the oscillator signal. The system also includes means for switching between passing the first output signals during a frequency acquisition mode and passing the second output signals during a phase lock mode. The system also includes means for filtering the passed first or second output signals. The system also includes means for adjusting a frequency of the oscillator signal in response to the filtered first or second output signals.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE FIGURES

Embodiments of the present invention and their advantages are best understood by referring to the detailed description that follows. It should be appreciated that like reference numerals are used to identify like elements illustrated in one or more of the figures.

DETAILED DESCRIPTION

In accordance with embodiments further described herein, various techniques are provided to perform CDR operations. Although such techniques are primarily described herein with regard to USB 3.0 devices and communications, other systems may also be used in various embodiments.

Figure 1:
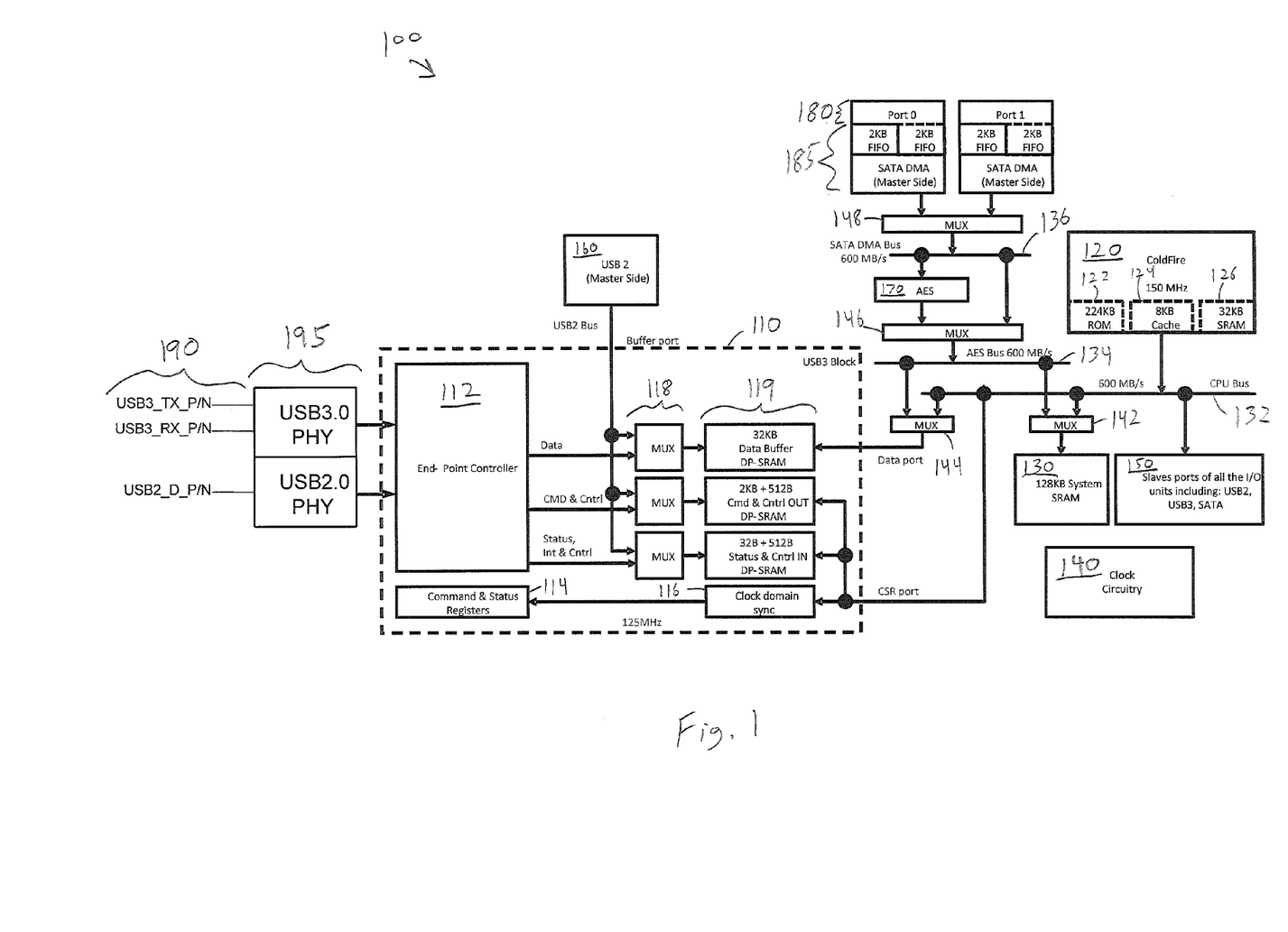
FIG. 1 illustrates a block diagram of a system which may be used to interface with a variety of different devices over various ports in accordance with an embodiment of the present invention.

FIG. 1 illustrates a block diagram of a system 100 which may be used to interface with a variety of different devices over various ports. In one embodiment, system 100 may be implemented as a system on a chip that manages communications between a host device and one or more other devices. For example, system 100 may be used to provide bridging, hosting, and/or hub operations in accordance with various communication protocols.

System 100 includes a device controller 110, a processor 120, system memory 130, clock circuitry 140, slave ports 150, a configuration port 160, an encryption block 170, communication ports 180, physical layer components 185, communication ports 190, and physical layer components 195.

As shown in FIG. 1, system 100 includes various busses 132, 134, and 136, and multiplexers 142, 144, 146, and 148 to facilitate communications between device controller 110, processor 120, system memory 130, slave ports 150, encryption block 170, physical layer components 185, and physical layer components 195.

Device controller 110 may be configured to manage communications to and from physical layer components 195 associated with communication ports 190. For example, device controller 110 may be used to host one or more devices connected to communication ports 190. In one embodiment, device controller 110 may be implemented as a universal serial bus (USB) controller configured to permit system 100 to operate as a USB host to one or more USB slave devices connected to communication ports 190. As shown in FIG. 1, device controller 110 includes an end point controller 112, command and status registers 114, a clock domain synchronization block 116, multiplexers 118, and various memory blocks and buffers 119.

Processor 120 may be implemented, for example, as a Coldfire processor operating at 150 MHz with various associated memories and caches 122, 124, and 126. Processor 120 may be used, for example, to perform various bridging, hosting, and/or hub operations for communications exchanged between communication ports 180 and 190 as well as slave ports 150.

System memory 130 may be used by processor 120 and/or other components of system 100 to support the various operations of system 100. Clock circuitry 140 may be used to provide one or more clock signals to system 100. Slave ports 150 may be used to interface system 100 with various types of slave devices as may be desired in various implementations. Configuration port 160 may be implemented, for example, as a USB 2.0 port used to configure system 100 for desired operations. Encryption block 170 may be implemented, for example, to perform Advanced Encryption Standard (AES) encryption on data passed between communication ports 180 and the rest of system 100.

Communication ports 180 may be implemented, for example, as storage media device ports configured to support communications with storage media devices such as hard drives, flash drives (e.g., thumb drives, solid state drives, or others), optical storage media (e.g., CD-ROM, DVD, HD-DVD, Blu-Ray, or others), or other appropriate storage media devices. Such storage media device ports may be implemented in accordance with Serial Advanced Technology Attachment (SATA) interfaces, external SATA (eSATA) interfaces, Parallel Advanced Technology Attachment (PATA) interfaces, flash memory interfaces, or others. In the embodiment shown in FIG. 1, communication ports 180 are implemented as SATA interfaces. Physical layer components 185 may be used to facilitate communications between communication ports 180 and the rest of system 100.

Communication ports 190 may be implemented, for example, in accordance with various communication standards such as, for example, USB 3.0, USB 2.0, Firewire (e.g., IEEE 1394), or others. In the embodiment shown in FIG. 1, communication ports 190 are implemented as USB 2.0 and USB 3.0 ports. Physical layer components 195 may be used to facilitate communications between communication ports 190 and the rest of system 100.

In one embodiment, an external host device may be connected to one of communication ports 190. In this embodiment, system 100 may be configured to host one or more devices connected to communication ports 180 and/or 190 on behalf of the host device. In this regard, system 100 may facilitate communications between the host device and/or the various hosted devices.

In one embodiment, physical layer components 195 may include CDR components and related circuitry to support CDR operations further described herein.

Figure 2:
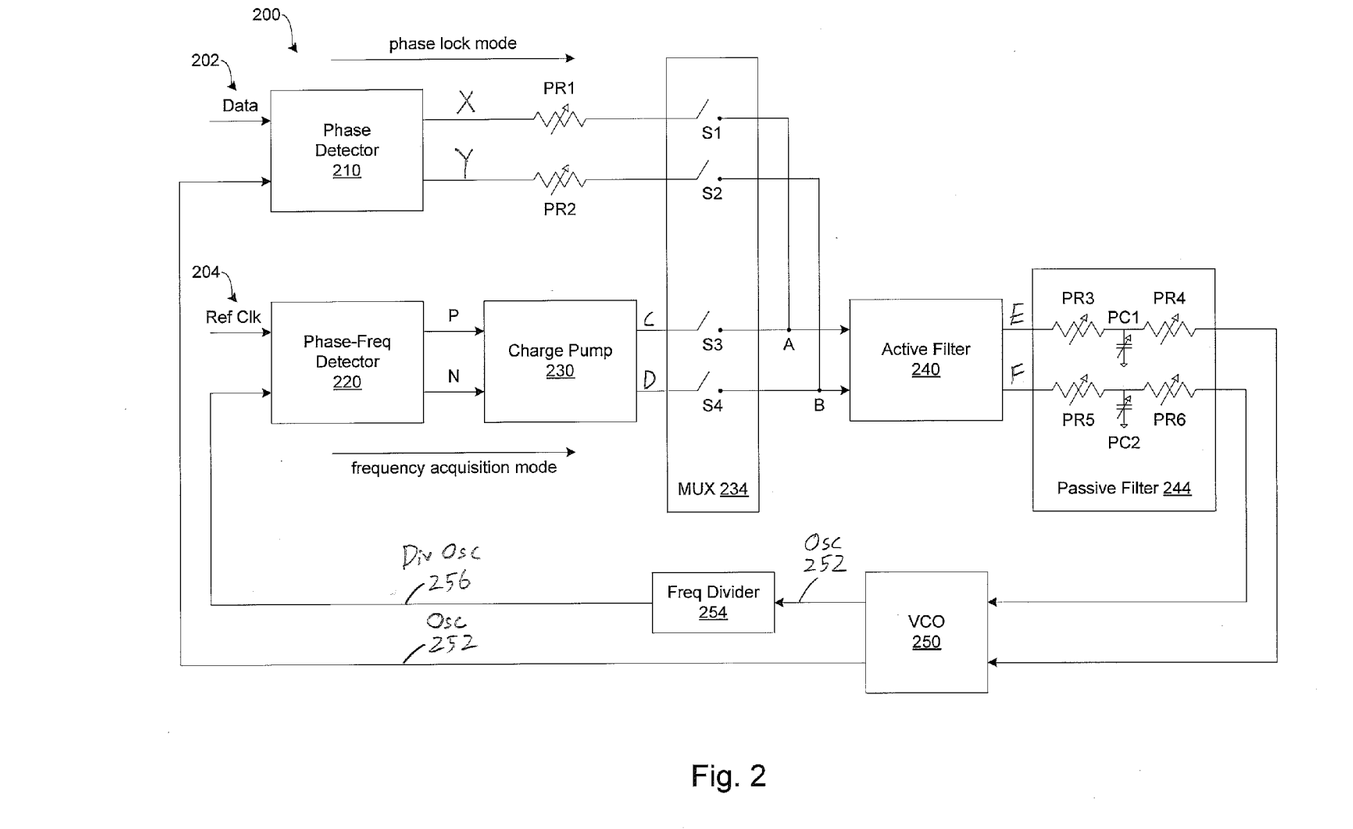
FIG. 2 illustrates a CDR system in accordance with an embodiment of the present invention.

FIG. 2 illustrates a CDR system 200 in accordance with an embodiment of the present invention. As shown in FIG. 2, CDR system 200 comprises a phase detector 210, adjustable (e.g., programmable) resistors PR1 and PR2, a phase-frequency detector 220, a charge pump 230, a multiplexer (MUX) 234 (including switches S1, S2, S3, and S4), an active filter 240, a passive filter 244 (e.g., also referred to as a post filter and also including adjustable resistors PR3, PR4, PR5, and PR6, and adjustable capacitors PC1 and PC2), an oscillator 250 (e.g., a VCO as further described herein or any other appropriate type of oscillator), and a frequency divider 254 (e.g., a divide by N frequency divider).

In one embodiment, CDR system 200 may be used as PLL circuit which may be selectively operated in a frequency acquisition mode or a phase lock mode. To operate in the frequency acquisition mode, CDR system 200 may provide a frequency acquisition loop including phase-frequency detector 220, charge pump 230, multiplexer 234, active filter 240, passive filter 244, VCO 250, and frequency divider 254. During the frequency acquisition mode, switches S1 and S2 may be open and switches S3 and S4 may be closed. The frequency acquisition loop may be used to perform an initial frequency lock between a reference clock signal (Ref Clk) 204 (e.g., provided by a 20 MHz reference clock or other appropriate clock speed) and a divided oscillator signal (Div Osc) 256 provided by VCO 250 and frequency divider 254. As a result, the frequency of VCO 250 may be locked to a frequency very close to the expected signal of an incoming data signal 204. For example, if reference clock signal 204 is approximately 20 MHz and frequency divider 254 operates to divide an oscillator signal (Osc) 252 of VCO 250 by an integer value of 250, then oscillator signal 252 may be locked to a frequency of approximately 5 GHz which is the expected frequency of a high speed data signal such as a 5 GHz USB 3.0 Super Speed signal provided by incoming data signal 204.

After achieving a frequency lock using the frequency lock loop, CDR system 200 may be switched to operate in the phase lock mode. To operate in the phase lock mode, CDR system 200 may provide a phase locking loop including phase detector 210, adjustable resistors PR1 and PR2, multiplexer 234, active filter 240, passive filter 244, and VCO 250. During the frequency acquisition mode, switches S1 and S2 may be closed and switches S3 and S4 may be open. The phase locking loop may be used to perform a phase lock between incoming data signal 202 (e.g., a high speed data signal such as a 5 GHz USB 3.0 Super Speed signal) and oscillator signal 252 (e.g., which may also be locked to a frequency of approximately 5 GHz as a result of the previously-performed frequency lock using the frequency acquisition loop). As a result, the frequency of VCO 250 may be frequency locked and phase locked to incoming data signal 204 to permit further clock and data recovery operations to be performed. For example, while VCO 250 is frequency locked and phase locked to incoming data signal 204, VCO 250 can effectively be used as a clock reference for the decoding of data encoded in incoming data signal 202.

Turning now to the particular components of CDR system 200, phase detector 210 may be implemented in accordance with appropriate circuitry known in the art to provide phase detection signals X and Y (e.g., output signals) in response to incoming data signal 202 and oscillator signal 252.

Phase-frequency detector 220 may be implemented in accordance with appropriate circuitry known in the art to provide phase-frequency detection signals P and N (e.g., output signals) in response to reference clock signal 204 and divided oscillator signal 256.

Charge pump 230 is adapted to receive one or more of phase-frequency detection signals P and N from phase-frequency detector 220 and provide charge pump signals C and D (e.g., output signals) in response thereto. In one embodiment, charge pump 230 may be implemented without passive filters, in contrast to conventional charge pumps which typically include one or more passive filters.

Multiplexer 234 may be implemented to selectively switch between passing charge pump signals C and D (e.g., during a frequency acquisition mode) and phase detection signals X and Y (e.g., during a phase lock mode) to nodes A and B.

During the frequency acquisition mode, charge pump signals C and D pass through switches S3 and S4 to nodes A and B. During the phase lock mode, phase detection signals X and Y pass through adjustable resistors PR1 and PR2, and switches S1 and S2 to nodes A and B.

Active filter 240 is adapted to receive phase detection signals X and Y or charge pump signals C and D at nodes A and B, and provide active filter signals E and F (e.g., output signals) in response thereto. In one embodiment, active filter 240 may be implemented without input resistors, in contrast to conventional active filters which typically include one or more input resistors. Advantageously, phase-frequency detection signals P and N may be provided to charge pump 230, and charge pump signals C and D may be provided to active filter 240 without passing through resistors (e.g., adjustable resistors PR1 and PR2). As a result, the open loop gain of CDR system 200 may be increased (e.g., by a factor of several hundred) which may result in a smaller static phase offset and thus more reliable operation of CDR system 200 when operating in the frequency acquisition mode.

Passive filter 244 may be interposed between active filter 240 and VCO 250 to provide high frequency noise rejection for active filter signals E and F, and thus improve the reliability and performance of CDR system 200.

VCO 250 may be implemented in accordance with appropriate circuitry known in the art to provide oscillator signal 252 in response to active filter signals E and F. In various embodiments, oscillator signal 252 provided by VCO 250 may have a higher or lower frequency than the frequency of active filter signals E and F.

Frequency divider 254 (e.g., a divide by N frequency divider), may be implemented in accordance with appropriate circuitry known in the art to divide oscillator signal 252 by an appropriate value (e.g., an integer value N, such as 250) to provide divided oscillator signal 256.

In one embodiment, referring to CDR system 200, the adjustable resistors PR1, PR2, PR3, PR4, PR5, and PR6, and adjustable capacitors PC1 and PC2 may be selectively adjusted (e.g., by system 100) to adjust the bandwidth and damping factor (e.g., the closed loop frequency response and peaking exhibited around a corner frequency) of the frequency acquisition loop and the phase locking loop independently from each other.

Figure 3:
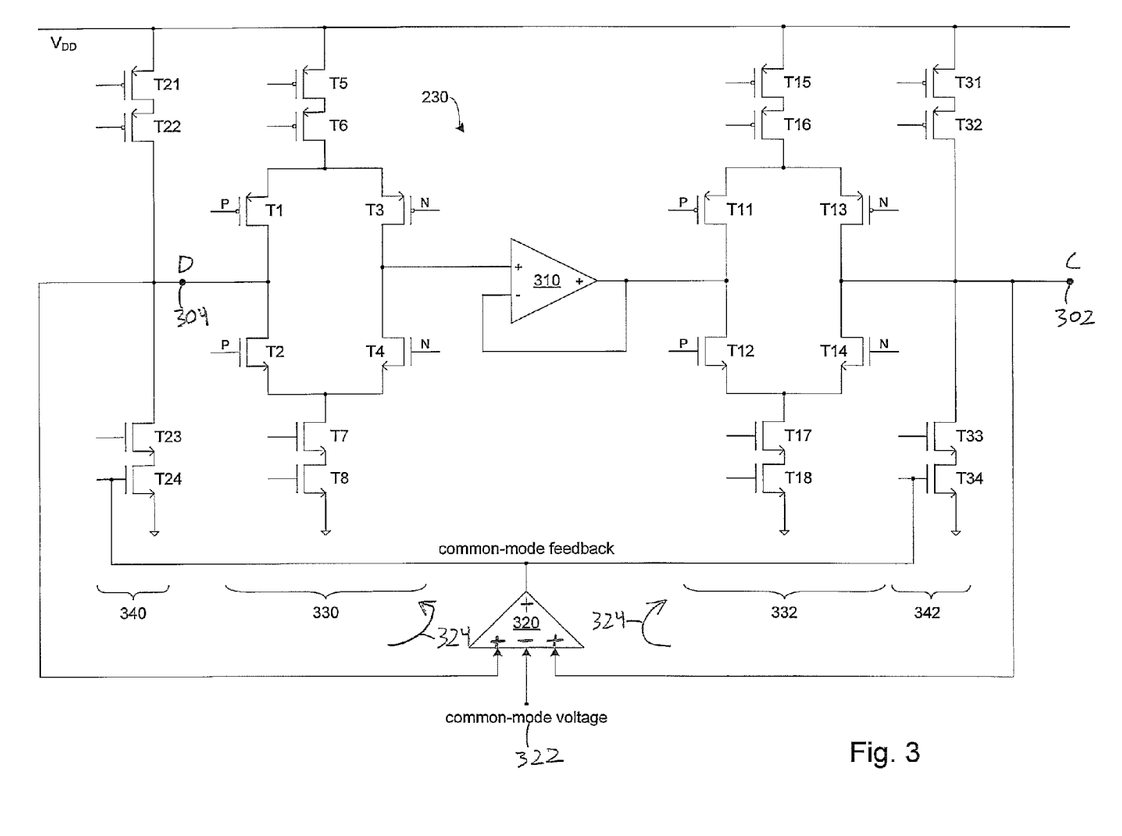
FIG. 3 illustrates a charge pump in accordance with an embodiment of the present invention.

FIG. 3 illustrates an embodiment of the charge pump 230 of FIG. 2. In one embodiment, the charge pump 230 includes a common-mode feedback loop 324 for charge pump signals C and D to stabilize a common-mode voltage 322 in the frequency acquisition mode of operation to provide a large dynamic range for charge pump signals C and D. In this regard, the value of common-mode voltage 322 may affect the operation of CDR system 200, and an unstable common-mode voltage 322 may result in CDR system 200 falling out of lock.

As shown in FIG. 3, the charge pump 230 includes amplifiers 310 and 320, and a plurality of circuit parts 330, 332, 340, and 342. Circuit part 330 includes transistors T1, T2, T3, and T4 configured as differential pairs adapted to receive phase-frequency detection signals P and N from phase-frequency detector 220. Circuit part 330 also includes biasing transistors T5, T6, T7, and T8. Similarly, circuit part 332 includes transistors T11, T12, T13, and T14 configured as differential pairs adapted to receive phase-frequency detection signals P and N from phase-frequency detector 220. Circuit part 332 also includes biasing transistors T15, T16, T17, and T18. Circuit part 340 includes biasing transistors T21, T22, T23, and T24, and circuit part 342 includes biasing transistors T31, T32, T33, and T34.

As shown in FIG. 3, charge pump 320 may provide charge pump signals C and D at nodes 302 and 304 in response to phase-frequency detection signals P and N.

Amplifier 310 may be used to provide a unity gain to balance the differential pairs between circuit parts 330 and 332. Amplifier 320 (e.g., configured as a comparator in this embodiment) may be used to provide common-mode feedback loop 324. In this regard, amplifier 320 receives charge pump signals C and D and a common-mode voltage 322, and selectively biases transistors T24 and T34 in response to a comparison between charge pump signals C and D and common-mode voltage 322.

As shown in FIG. 3, charge pump 230 may be implemented without passive filters connected to nodes 302 and 304, in contrast to conventional charge pumps which typically include one or more passive filters connected to their associated output nodes. In this regard, instead of using passive filters, CDR system 200 may instead include active filter 240. In one embodiment, this substitution (e.g., using active filter 240 instead of passive filters) may permit CDR system 200 to operate with increased open loop gain which may result in a smaller static phase offset as discussed herein. Also in this embodiment, the substitution may increase the dynamic range of the frequency acquisition loop of CDR system 200. For example, without active filter 240, the dynamic range may be limited by the output of charge pump 230 when CDR system 200 is powered by a given power supply. However, with active filter 240, the dynamic range may be significantly higher using the same power supply.

Figure 4:
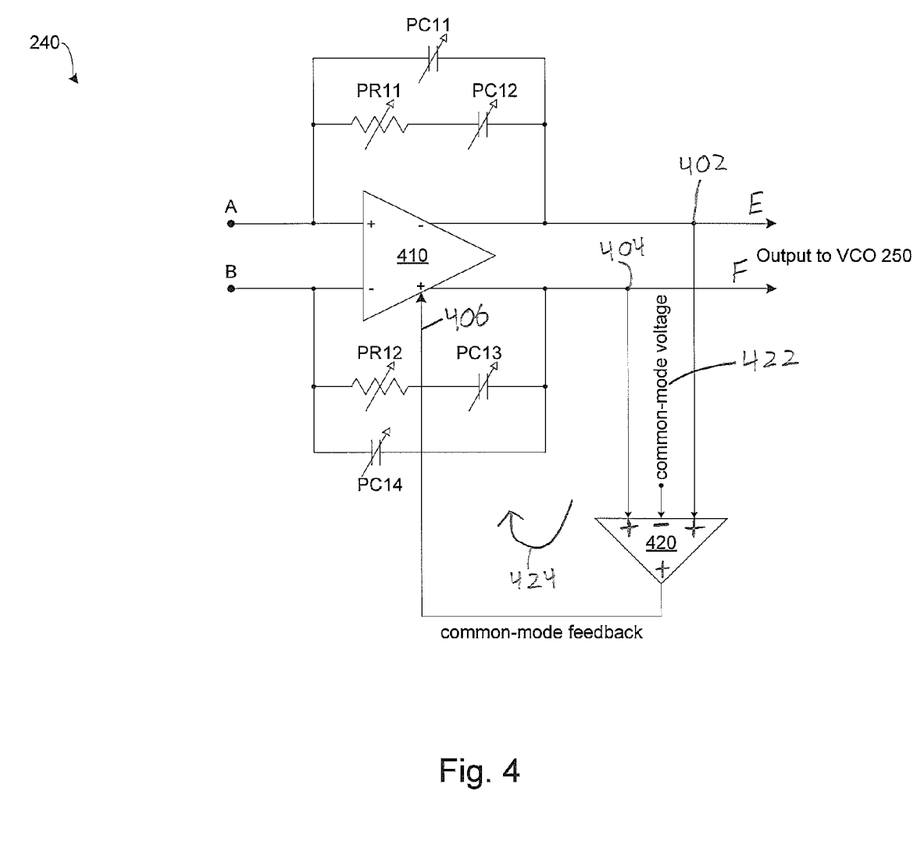
FIG. 4 illustrates an active filter in accordance with an embodiment of the present invention.

FIG. 4 illustrates an embodiment of the active filter 240 of FIG. 2. In one embodiment, the active filter 240 includes a common-mode feedback loop 424 to stabilize a common-mode voltage 422 in the phase lock mode of operation to provide a large dynamic range for tuning the VCO 250 (e.g., provide a large dynamic range for active filter signals E and F) and to increase the reliability of frequency and phase lock operations performed by CDR system 200. In one embodiment, common-mode voltage 422 may be the same voltage as common-mode voltage 322. In another embodiment, common-mode voltages 322 and 422 may be different voltages. Active filter 240 includes amplifiers 410 and 420, adjustable resistors PR11 and PR12, and adjustable capacitors PC11, PC12, PC13, and PC14.

Amplifier 410 may provide active filter signals E and F at nodes 402 and 404 in response to charge pump signals C and D (e.g., during a frequency acquisition mode) or phase detection signals X and Y (e.g., during a phase lock mode) received at nodes A and B.

Amplifier 420 (e.g., configured as a comparator in this embodiment) may be used to provide common-mode feedback loop 424. In this regard, amplifier 420 receives active filter signals E and F and a common-mode voltage 422, and provides a reference voltage 406 to amplifier 420.

Advantageously, active filter 240 may be implemented without input resistors connected to nodes A and B during the frequency acquisition mode, in contrast to conventional active filters which typically include one or more input resistors connected to their associated input nodes. As discussed, this configuration may increase the open loop gain of CDR system 200 which may result in a smaller static phase offset and thus more reliable operation of CDR system 200 when operating in the frequency acquisition mode.

In one embodiment, the open loop gain of active filter 240 is proportional to (Kd*Kv*Gopamp)/N, where Kd is the gain of phase detector 210 (during the phase lock mode) or phase frequency detector 220 (during the frequency acquisition mode), Kv is the gain of VCO 250, Gopamp is the DC gain of amplifier 410, and N is a frequency division ratio applied to oscillator signal 252 during the frequency acquisition mode (e.g., where N corresponds to the frequency division ratio applied by frequency divider 254, such as a frequency division integer value of 250) or during the phase lock mode (e.g., where no frequency division occurs and thus N equals an integer value of 1). Thus, it will be appreciated that the open loop gain of active filter 240 may differ between the frequency acquisition mode and the phase lock mode. For example, if frequency divider 254 is set to divide oscillator signal 252 by an integer value of 250, then the open loop gain of active filter 240 during the frequency acquisition mode will be 250 times lower than the open loop gain during the phase lock mode. In this example, the lower open loop gain associated with the frequency acquisition mode may result in a larger static phase offset.

In one embodiment, the open loop gain of active filter 240 during the frequency acquisition mode may be increased by implementing charge pump 230 with a charge pump gain. In this embodiment, the open loop gain of active filter 240 during the frequency acquisition mode is proportional to (Kd*Kv*Gopamp*Gcharge pump)/N, where Gcharge pump is the additional gain provided by charge pump 230. Because charge pump 230 is used in the frequency acquisition mode but not in the phase lock mode, the charge pump gain may be used to increase the open loop gain of active filter 240 (e.g., by a factor of 250 or larger) during the frequency acquisition mode without affecting the open loop gain during the phase lock mode.

As discussed, CDR system 200 may be implemented with common-mode feedback loop 324 in charge pump 230, and common-mode feedback loop 424 in active filter 240. During the frequency acquisition mode (e.g., when charge pump 230 is used to adjust the frequency of VCO 250), in one embodiment, common-mode voltage 322 may be set to approximately half of a supply voltage (e.g., approximately VDD/2) to provide a large dynamic range for charge pump signals C and D. In one embodiment where CDR system 200 is implemented using deep sub-micro technology, the supply voltage (e.g., VDD) may be very low. Advantageously, by setting common-mode voltage 322 to approximately half of the supply voltage, charge pump signals C and D may exhibit a dynamic range comparable to that of active filter signals E and F. As a result, clock recovery operations may be performed with greater accuracy and performance.

During the phase lock mode (e.g., when phase detector 210 is used to adjust the frequency of VCO 250), in one embodiment, common-mode voltage 422 may be set (e.g., switched) to approximately common-mode voltage 322 to avoid disturbances when CDR system 200 switches from frequency acquisition mode to phase lock mode. Accordingly, the values of common-mode voltage 422 may be adjusted may be adjusted so that active filter signals E and F provide a large (e.g., maximum) dynamic range for CDR system 200.

In view of the present disclosure, it will be appreciated that CDR system 200 may be used to overcome various problems associated with conventional CDR systems. For example, charge pump 230 may be used during the frequency acquisition mode to frequency lock a low speed divided oscillator signal 256 with a similar low speed reference clock signal 204 (e.g., approximately 20 MHz). However, during the phase lock mode where a high speed oscillator signal 252 is phase locked to a high speed incoming data signal 202, charge pump 230 is not used to adjust VCO 250. Thus, charge pump 230 will not inhibit the response of VCO 250 to high speed incoming data signal 202.

In contrast to conventional CDR systems, active filter 240 does not include input resistors. In addition, as discussed, the gain provided by charge pump 230 may be adjusted to increase the open loop gain of active filter 240 (e.g., by a factor of 250 or larger) during the frequency acquisition mode without affecting the open loop gain during the phase lock mode.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A system comprising:
   an oscillator adapted to provide an oscillator signal;
   a frequency divider adapted to divide the oscillator signal to provide a divided oscillator signal;
   a phase-frequency detector adapted to provide phase-frequency detection signals in response to a reference clock signal and to the divided oscillator signal;
   a charge pump adapted to provide first output signals in response to the phase-frequency detection signals;
   a phase detector adapted to provide phase detection signals in response to an incoming data signal and to the oscillator signal;
   adjustable resistors adapted to provide second output signals in response to the phase detection signals;
   one or more switches adapted to pass the first output signals during a frequency acquisition mode and pass the second output signals during a phase lock mode wherein no charge pump is used in providing the second output signals during the phase lock mode; and
   an active filter adapted to filter the passed first or the passed second output signals, wherein the oscillator is adapted to adjust a frequency of the oscillator signal in response to the filtered first or the filtered second output signals.

2. The system of claim 1, wherein:
   the phase-frequency detector, the charge pump, the one or more switches, the active filter, the oscillator, and the frequency divider provide a frequency acquisition loop adapted to adjust a frequency of the divided oscillator signal during the frequency acquisition mode to substantially lock the divided oscillator signal with a frequency of the reference clock signal;
   the phase detector, the one or more switches, the active filter, and the oscillator provide a phase locking loop adapted to adjust a phase of the oscillator signal during the phase lock mode to substantially lock the oscillator signal with a phase of the incoming data signal; and
   the oscillator signal corresponds to a recovered clock associated with the incoming data signal after the oscillator signal is substantially locked with the phase of the incoming data signal.

3. The system of claim 1, wherein the incoming data signal is a high speed data signal and the reference clock signal is a low speed clock signal.

4. The system of claim 3, wherein the incoming data signal is an approximately GHz clock signal and the reference clock signal is an approximately 20 MHz clock signal.

5. The system of claim 3, wherein the incoming data signal is a Universal Serial Bus (USB) 3.0 Super Speed signal.

6. The system of claim 1, wherein the charge pump comprises a common-mode feedback loop adapted to stabilize a common-mode voltage of the charge pump during the frequency acquisition mode to improve a dynamic range of the first output signals.

7. The system of claim 1, wherein the active filter comprises a common-mode feedback loop adapted to stabilize a common-mode voltage of the active filter during the phase lock mode to improve a dynamic range of the second output signals.

8. The system of claim 7, wherein the system is adapted to set the common-mode voltage of the active filter to approximately a common-mode voltage of the second output signals to reduce disturbance when the system switches from the frequency acquisition mode to the phase lock mode.

9. The system of claim 1, further comprising a passive filter interposed between the active filter and the oscillator, wherein the passive filter comprises one or more adjustable resistors and one or more adjustable capacitors.

10. A method comprising:
    providing an oscillator signal using an oscillator;
    dividing the oscillator signal using a frequency divider to provide a divided oscillator signal;
    providing phase-frequency detection signals from a phase-frequency detector in response to a reference clock signal and to the divided oscillator signal;
    providing first output signals from a charge pump in response to the phase-frequency detection signals;
    providing phase detection signals from a phase detector in response to an incoming data signal and to the oscillator signal;
    providing second output signals from one or more adjustable resistors in response to the phase detection signals;
    switching between passing the first output signals during a frequency acquisition mode and passing the second output signals during a phase lock mode wherein no charge pump is used in providing the second output signals the during phase lock mode; and
    filtering the passed first or the passed second output signals using an active filter, wherein the oscillator is adapted to adjust a frequency of the oscillator signal in response to the filtered first or the filtered second output signals.

11. The method of claim 10, further comprising:
    adjusting a frequency of the divided oscillator signal to substantially lock the divided oscillator signal with a frequency of the reference clock signal during the frequency acquisition mode;
    adjusting a phase of the oscillator signal to substantially lock, the oscillator signal with a phase of the incoming data signal; and
    wherein the oscillator signal corresponds to a recovered clock associated with the incoming data signal after the oscillator signal is substantially locked with the phase of the incoming data signal.

12. The method of claim 10, wherein the incoming data signal is a high speed data signal and the reference clock signal is a low speed clock signal.

13. The method of claim 12, wherein the incoming data signal is an approximately 5 GHz clock signal and the reference clock signal is an approximately 20 MHz clock signal.

14. The method of claim 12, wherein the incoming data signal is a Universal Serial Bus (USB) 3.0 Super Speed signal.

15. The method of claim 10, stabilizing a common-mode voltage of the charge pump during the frequency acquisition mode using a common-mode feedback loop of the charge pump to improve a dynamic range of the first output signals.

16. The method of claim 10, stabilizing a common-mode voltage of the active filter during the phase lock mode using a common-mode feedback loop of the active filter to improve a dynamic mime of the second output signals.

17. The method of claim 16, further comprising setting the common-mode voltage of the active filter to approximately a common-mode voltage of the second output signals to reduce disturbance during the switching.

18. The method of claim 10, wherein the filtering further comprises filtering the filtered first or second output signals using a passive filter before the filtered signals are provided to the oscillator.

19. A system comprising:
   means for providing an oscillator signal;
   means for dividing the oscillator signal to provide a divided oscillator signal;
   means for providing phase-frequency detection signals in response to a reference clock signal and to the divided oscillator signal;
   means for providing first output signals from a charge pump in response to the phase-frequency detection signals;
   means for providing phase detection signals in response to an incoming data signal and to the oscillator signal;
   means for providing second output signals from one or more adjustable resistors in response to the phase detection signals;
   means for switching between passing the first output signals during a frequency acquisition mode and passing the second output signals during a phase lock mode wherein no charge pump is used in providing the second output signals during the phase lock mode;
   means for filtering the passed first or the passed second output signals; and
   means for adjusting a frequency of the oscillator signal in response to the filtered first or the filtered second output signals.

\* \* \* \* \*

UNITED STATES PATENT AND TRADEMARK OFFICE
CERTIFICATE OF CORRECTION

PATENT NO.        : 8,971,423 B1
APPLICATION NO.   : 12/721432
DATED             : March 3, 2015
INVENTOR(S)       : Wei Fu et al.

It is certified that error appears in the above-identified patent and that said Letters Patent is hereby corrected as shown below:

In the Claims

Column 11,
Claim 16, line 14, "...dynamic mime of the second output signals..." ---Change to--- "...dynamic range of the second output signals..."

Signed and Sealed this
Twenty-third Day of June, 2015

Michelle K. Lee
*Director of the United States Patent and Trademark Office*